(12) United States Patent
Yokouchi et al.

(10) Patent No.: US 6,430,203 B1
(45) Date of Patent: Aug. 6, 2002

(54) SEMICONDUCTOR LASER DEVICE WITH NON-OXIDIZED FACET REGIONS

(75) Inventors: Noriyuki Yokouchi, Yokohama; Norihiro Iwai, Tokyo, both of (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/581,256
(22) PCT Filed: Oct. 26, 1999
(86) PCT No.: PCT/JP99/05907
§ 371 (c)(1), (2), (4) Date: Jun. 27, 2000
(87) PCT Pub. No.: WO00/25400
PCT Pub. Date: May 4, 2000

(30) Foreign Application Priority Data

Oct. 27, 1998 (JP) ............ 10-305609

(51) Int. Cl.$^7$ ................. H01S 5/00
(52) U.S. Cl. ............ 372/45; 372/50
(58) Field of Search ............ 372/43, 45, 46, 372/50

(56) References Cited

U.S. PATENT DOCUMENTS 6,018,539 A * 1/2000 Kimura et al. .......... 372/45
6,281,523 B1 * 8/2001 Iwai et al. ............... 257/98

FOREIGN PATENT DOCUMENTS

JP          124548 A  *  4/2000    ............. H01S/5/22

* cited by examiner

Primary Examiner—Paul Ip
Assistant Examiner—Davienne Monbleau
(74) Attorney, Agent, or Firm—Oblon, Spivak, McClelland, Maier & Neustadt, P.C.

(57) ABSTRACT

A semiconductor laser device in which a ridge structure including a layer comprised of an Al-containing compound semiconductor is formed at an upper portion, with both side portions of the layer being oxidized, and the laser-beam emitting face of the ridge structure is a non-oxidized area. As this reduces the ratio of defective cleaved faces, the production cost of the semiconductor laser device becomes lower, and because of the lower threshold current, the degradation of the characteristics over a long operational period does not likely occur.

3 Claims, 9 Drawing Sheets

SEMICONDUCTOR LASER DEVICE WITH
NON-OXIDIZED FACET REGIONS

CROSS-REFERENCE TO RELATED
APPLICATION

This patent application is a National Stage patent application filed under 35 U.S.C. §371, based on PCT Application PCT/JP99/05907, filed on Oct. 22, 1999 and claims the benefit of the earlier filing date thereof.

BACKGROUND OF THE INVENTION

1. Field of the Invention

The present invention relates to a semiconductor laser device, and, more particularly, to a semiconductor laser device which has the ratio of a defective laser-beam emitting face reduced at the time of production, thus reducing the production cost and making the deterioration of characteristics over a long operational period difficult to occur.

2. Discussion of the Background

A ridge stripe semiconductor laser device as shown in FIG. 1 is known.

This semiconductor laser device has a stripe-shaped ridge structure B0 formed on a substrate 1 and one facet formed as a low-reflection face and the other facet as a high-reflection face.

This semiconductor laser device has a strained quantum well active layer 2 of, for example, i-type (nondoped) GaInAsP stacked, by epitaxial growth, on the substrate 1 of, for example, n-type InP and an n-type semiconductor buffer layer (not shown) formed on the substrate. Formed in order on the layer 2 are a spacer layer 3 of p-type InP, a layer 4 of an Al-containing compound semiconductor such as p-type AlInAs, and a layer 5 of p-type InP, thereby forming an upper clad layer as a whole on which a contact layer 6 of, for example, p-type GaInAsP is stacked. This layer structure forms the ridge structure B0.

The surfaces of the ridge structure B0 and the substrate 1 are coated with an insulation protection film 7 of, for example, SiNx (silicon nitride). The insulation protection film 7 is removed at the top portion of the ridge structure B0 where an upper electrode 8 of, for example, Ti/Pt/Au is formed in contact with the contact layer 6, and a lower electrode 9 of, for example, an AuGeNi alloy is formed at the bottom surface of the substrate.

The structural feature of this semiconductor laser device lies in that both side portions 4a, 4a of the aforementioned layer 4 are insulation areas essentially consisting of an Al oxide, so that when a current is supplied from the upper electrode 8, both side portions 4a, 4a and a center portion 4b together serve as a current constriction layer.

This semiconductor laser device is, roughly, produced as follows. First, the buffer layer of, for example, n-type InP, the strained quantum well active layer 2 of i-type GaInAsP, the spacer layer 3 of p-type InP, the layer 4 of p-type AlInAs, the layer 5 of p-type InP and the contact layer 6 of p-type GaInAsP are stacked in order on a wafer of n-type InP, which has a predetermined planar dimension, by epitaxial growth, thereby yielding a semiconductor layer structure which is flat as a whole. Then, a thin film of SiNx (silicon nitride) is formed covering the entire surface of this layer structure.

Then, the SiNx (silicon nitride) thin film is made into a pattern of a plurality of stripes having the equal width in the lengthwise direction by using an ordinary photolithography technique. With this pattern as a mask, for example, reactive ion beam etching is performed to etch out at least that portion of the aforementioned layer structure which extends to the spacer layer 3, forming a plurality of stripe-shaped ridge structures B0. Therefore, the contact layer and both side portions of the upper clad layer are exposed at the sides of each ridge structure.

Then, the entire structure is heated under a vapor atmosphere for a predetermined time. During this process, the Al component in the layer 4 of an Al-containing compound semiconductor in the upper clad layer is sequentially oxidized to become an Al oxide from both side portions toward the center portion. As a result, both side portions 4a, 4a of this layer 4 become an insulation area and the center portion 4b stays as a non-oxidized area. Because the other layers in the upper clad layer do not contain an Al component, no oxidation occurs at both side portions.

As the portion directly above the active layer 2 stays as a layer structure having a conductivity after the aforementioned oxidizing process and both side portions of its upper portion are insulation areas, and therefore, a current constriction structure with respect to the active layer is formed there.

Then, SiNx (silicon nitride) is deposited again covering the entire surface, thereby forming the insulation protection film 7, after which the insulation protection film only at the top portion of the ridge structure B0 is removed to expose the contact layer 6.

Then, for example, Ti/Pt/Au is vapor-deposited on the entire surface by electron beam vapor deposition, thereby forming the upper electrode 8 in contact with the contact layer 6, and after the bottom surface of the wafer is polished, an AuGeNi alloy, for example, is vapor-deposited there, thus forming the lower electrode 9.

Next, this wafer is cleaved into a bar in a direction perpendicular to the lengthwise direction of each of the ridge structure formed in stripes. The cleaved face of the acquired bar becomes the laser-beam emitting face. Thereafter, the individual ridge structures are separated in the lengthwise direction, yielding intended semiconductor laser devices.

In this semiconductor laser device, the area R around that portion of the active layer 2 which is located directly below the center portion 4b of the layer 4 is a luminescence area.

This semiconductor laser device has such an advantage that its production, especially, the formation of the current constriction structure is easy. The semiconductor laser device however has the following shortcomings.

First, when both side portions 4a, 4a of the layer 4 comprised of the Al-containing compound semiconductor are oxidized to be insulation areas, the volumes of both side portions 4a, 4a shrink during this oxidation process so that a large strain might storage in the crystal in this portion. When the wafer is cleaved, cracks C may run upward or downward from the layer 4 at the cleaved face as shown in FIG. 2 due to this strain so that the cleaved face does not become flat, or the cracks C may extend to the luminescence area R. When such a crack C occurs on the cleaved face, the threshold current of the laser beam increases and what is more, there occurs a problem of a time-dependent degradation of the optical output characteristics.

That is, the above-described semiconductor laser device has such a problem that the laser-beam emitting face or the cleaved face is likely to become defective at the time of cleaving the wafer in the production process, which results in a higher production cost and is likely to lead to the degradation of the characteristics over a long operational period.

SUMMARY OF THE INVENTION

It is an object of the present invention to provide a semiconductor laser device which has no cracks formed on the cleaved face (laser-beam emitting face) at the time of cleaving a wafer or can prevent the threshold current of the laser beam from rising due to cracks if produced, thus reducing defective laser-beam emitting faces, which makes it difficult to cause the degradation of the characteristics over a long operational period.

To achieve the above object, according to this invention, there is provided a semiconductor laser device (hereinafter called "device B1") comprising:

a ridge structure including a layer comprised of an Al-containing compound semiconductor formed at an upper portion, both side portions of the layer being oxidized; and a laser-beam emitting face of the ridge structure being a non-oxidized area.

According to this invention, there is also provided a semiconductor laser device (hereinafter called "device B2") comprising:

a ridge structure including a layer comprised of an Al-containing compound semiconductor formed at an upper portion, both side portions of the layer being oxidized; and the width of the ridge structure in the vicinity of a laser-beam emitting face being wider than the width of the ridge structure in the center portion.

To begin with, the device B1 will be discussed with reference to the drawings. FIG. 3 is a perspective view showing the device B1, and FIG. 4 is a cross-sectional view along the line IV—IV in FIG. 3.

In the case of this device B1, the overall shape of a ridge structure A formed on a substrate 1 of, for example, n-type InP is such that two laser-beam emitting faces or cleaved faces are wide portions A1, A1 whose widths are equal to the width of the substrate 1, and the center portion located between those wide portions is a narrow portion A2 narrower than the substrate 1.

A strained quantum well active layer 2 of i-type GaInAsP, a spacer layer 3 of p-type InP, a layer 4 comprised of an Al-containing compound semiconductor such as p-type AlInAs, a layer 5 of p-type InP and a contact layer 6 of p-type GaInAsP are stacked on the substrate 1, the layer 4 included in the ridge structure A. The entire surface is coated with an insulation protection film 7 of SiNx (silicon nitride). An upper electrode 8 is formed on the contact layer 7, and a lower electrode 9 is formed on the bottom surface of the substrate 1.

In this device B1, the entire surface of a cleaved face S including a luminescence area R for a laser beam and both side portions 4c, 4c of the wide portion A1 are all non-oxidized surfaces. However, both side portions 4a, 4a of the layer 4 at the narrow portion A2 of the ridge structure have been oxidized to be insulation areas essentially consisting of an Al oxide.

Because this device B1 is produced by a method which will be discussed later, no cracks are produced in the vicinity of the layer 4 in the cleaved face S which is exposed by cleaving of the wafer so that the laser-beam emitting face is flat and does not adversely affect the luminescence area R at all. As both side portions 4a, 4a of the layer 4 at the narrow portion A2 of the ridge structure which is not cleaved are oxidized, the current constriction function of the laser device is demonstrated at the portions.

This device B1 can be produced as follows.

First, the strained quantum well active layer 2 of i-type GaInAsP, the spacer layer 3 of p-type InP, the layer 4 of p-type AlInAs, the layer 5 of p-type InP, the contact layer 6 of p-type GaInAsP and a thin film 7' of SiNx (silicon nitride) are stacked in order on an n-type InP wafer 1 by epitaxial growth, thereby yielding a layer structure as shown in FIG. 5.

Then, by employing a photolithography technique using a mask M1 having a planar pattern which has a regularly series of cross-like shapes and has a hexagonal opening formed between the cross-like shapes, the planar pattern of the mask M1 is transferred onto the SiNx (silicon nitride) thin film 7' of the layer structure as shown in FIG. 5.

The planar pattern of the mask M1 has planar patterns of the wide portion A1 of the ridge structure A of the device B1 shown in FIG. 3 linked together in the lengthwise direction with the planar pattern of the narrow portion A2 linking the linked patterns. Therefore, a transferred planar pattern M1' has a series of planar patterns in which wide portions A1' having a planar pattern equivalent to the planar pattern of the wide portion A1 in FIG. 3 are linked together and ridge structure A of the device B1 shown in FIG. 3 linked to one another with a narrow portion A2' having a planar pattern equivalent to the planar pattern of the narrow portion A2 in FIG. 3 as a link therebetween.

Then, with the transferred planar pattern M1' as a mask, reactive ion beam etching (RIBE) is carried out using a gas mixture of, for example, methane, argon and hydrogen to etch out that portion which extends at least to the spacer layer 3 located below the layer 4.

As a result, a mesa A' having the same pattern as the planar pattern M1' is formed on the substrate 1 as shown in FIG. 6. Therefore, the layer 4 of an Al-containing compound semiconductor is exposed at the sides of the hexagonal recesses of this mesa A'.

Then, the entire mesa A' shown in FIG. 6 is subjected to a heat treatment under a vapor environment. Specifically, it is heated at 500° C. in the vapor environment for about 150 minutes.

This heat treatment selectively oxidizes the layer 4 in the individual layers exposed at the sides of the hexagonal recesses, and the oxidization width of the layer 4 sequentially extends from the exposed portion toward inside. At this time, the oxidization width of the layer 4 at both side portions of the narrow portion A2' of the mesa A' is properly controlled by controlling the heating time.

After oxidization, the entire surface of the mesa A' is coated and SiNx (silicon nitride) is deposited again to form an insulation protection film, and then only SiNx (silicon nitride) of the insulation protection film on the narrow portion A2' of the mesa A' and the thin film 7' located below that insulation protection film is selectively removed, thus exposing the contact layer 6 there.

Then, Ti/Pt/Au is vapor-deposited on the entire surface of the mesa A' by, for example, electron beam vapor deposition to form the upper electrode 8, and after the bottom surface of the substrate 1 is polished, an AuGeNi alloy is vapor-deposited there, thus forming the lower electrode 9.

Next, cleaving is performed at the center line between the linked wide portions A1', A1', yielding bars, which are then processed to be separated into individual devices B1 shown in FIG. 3.

Because the cleaved face then is at the position of the center line between the linked wide portions A1', A1', the layer 4 at this portion has not been oxidized even in the heat treatment. Therefore, the cleaved face is a non-oxidized face, has no storaging of a strain generated by the oxidization of the layer 4 so that no cracks are produced at the time of cleaving, and is flat.

The device B2 will now be discussed.

In this device B2, as shown in FIG. 7, the portion in the vicinity of the cleaved face which is the laser-beam emitting face S in the ridge structure A formed on the substrate 1 is narrower than the substrate 1 and wider than a center portion A2.

In the case of this device B2, the ridge structure is patterned by using a mask M2 having a planar pattern as shown in FIG. 8 instead of the mask M1 used in producing the device 1 shown in FIG. 5.

Therefore, the mesa A' after RIBE is completed has the layer 4 of an Al-containing compound semiconductor exposed at the sides of the narrow portion (center portion) A2' and the wide portion A1' as shown in FIG. 9.

When this mesa A' is subjected to a heat treatment, therefore, the oxidization of the layer 4 progresses both in the wide portion A1' and the narrow portion A2'.

When this is cleaved, the layer 4 whose both side portions 4a, 4a have been oxidized and center portion 4b has not been oxidized is exposed through the cleaved face S, so that cracks C may be produced in the vicinity of both side portions 4a, 4a.

Because the oxidization width of the layer 4 at the narrow portion A2 is the same as the oxidization width of the layer 4 at the wide portion A1 and, what is more, the wide portion A1 is significantly wider than the narrow portion A2, the oxidized areas exposed through the cleaved face at the wide portion A1 or the portions where the cracks C are produced are located very far outward from the luminescence area R for a laser beam and do not adversely affect the laser emission characteristics.

BRIEF DESCRIPTION OF DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

EXAMPLES 1 AND 2 AND COMPARATIVE EXAMPLE (1) Production of Devices

Figure 5:
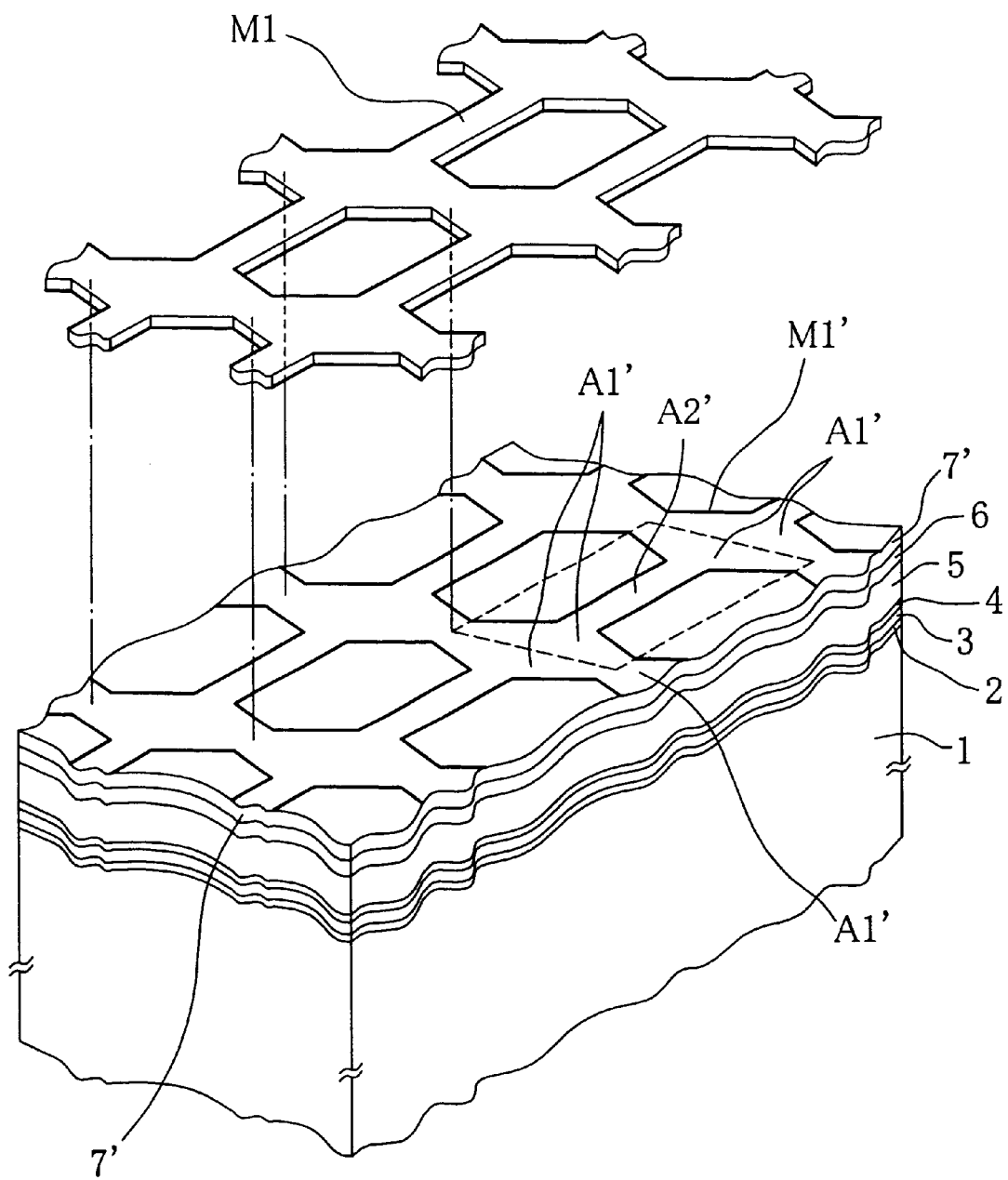
FIG. 5 is a perspective view depicting patterning of a ridge structure at the time of producing the device B1.

First, the buffer layer of n-type InP having a thickness of 1 μm was stacked on the n-type InP substrate 1, and the strained quantum well active layer 2 having four layers of i-type GaInAsP, the spacer layer 3 of p-type InP having a thickness of 0.1 μm, the layer 4 of p-type AlInAs having a thickness of 0.05 μm, the layer (clad layer) 5 of p-type InP having a thickness of 2 μm and the contact layer 6 of p-type GaInAsP having a thickness of 0.3 μm were stacked in order on the buffer layer, yielding the layer structure shown in FIG. 5. Further, the $Si_3N_4$ thin film 7' was deposited covering the entire surface of the contact layer 6.

Figure 8:
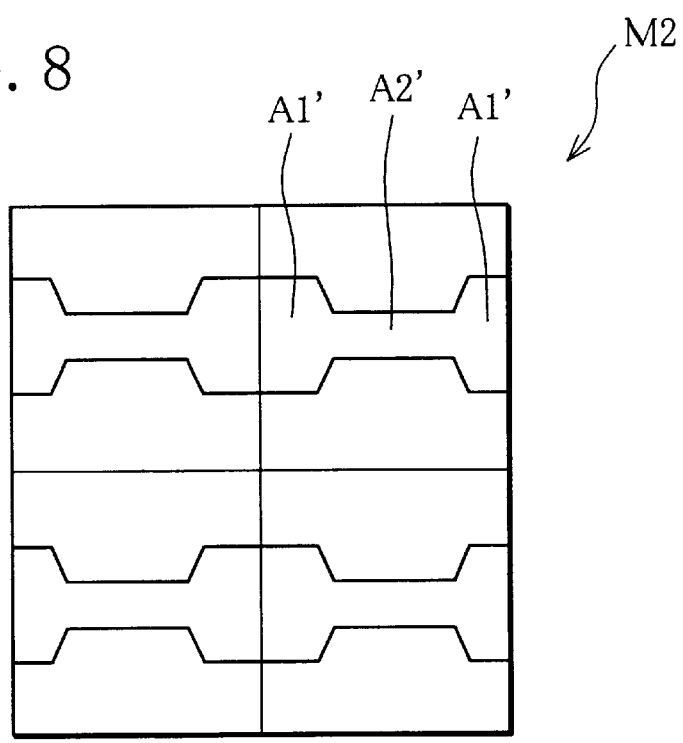
FIG. 8 is a plan view of a mask M2 which is used in producing the device B2.
Figure 9:
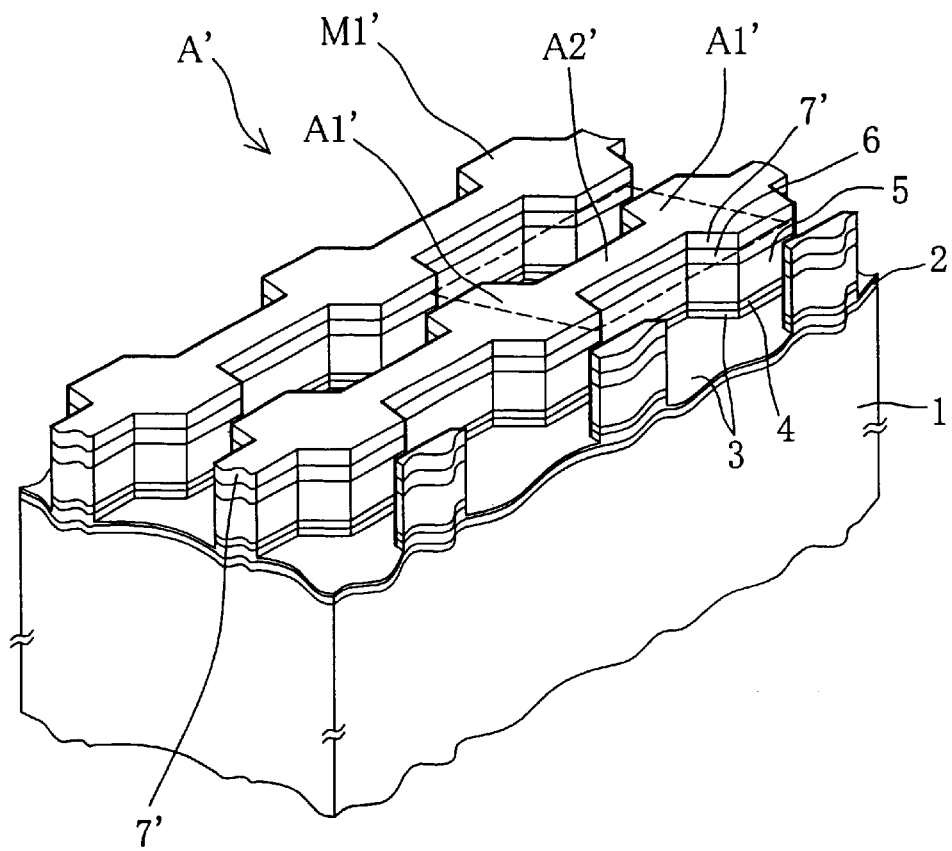
FIG. 9 is a perspective view showing the formation of the mesa A' of the device B2.

The mask M1 having the planar pattern shown in FIG. 5 and the mask M2 having the planar pattern shown in FIG. 8 were prepared. The narrow portion A2' of both the mask M1 and mask M2 has a width of 7 μm. The wide portion A1' of the mask M2 has a width of 30 μm.

Figure 6:
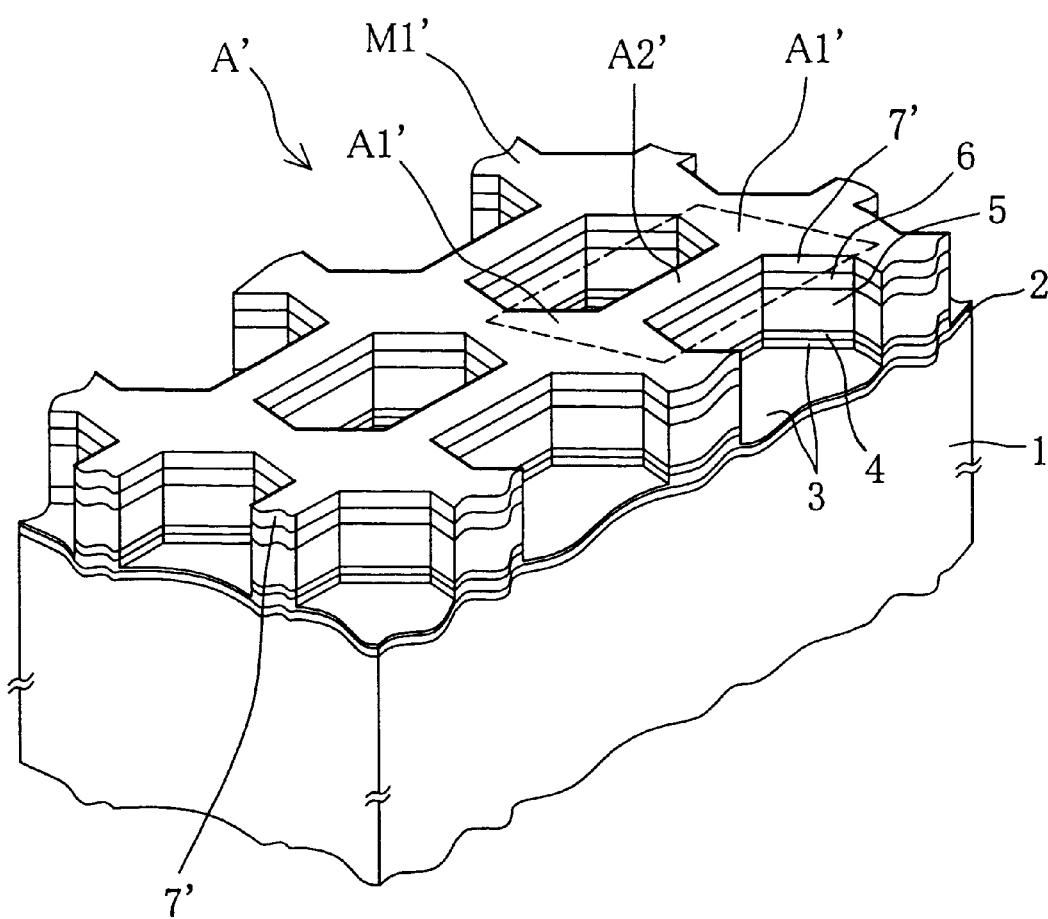
FIG. 6 is a perspective view showing the formation of the mesa A1' of the device B1.

After the planar pattern of the mask M1 was transferred onto the $Si_3N_4$ thin film 7' using a photolithography technique to the aforementioned layer structure using the mask M1, RIBE using a gas mixture of methane, argon and hydrogen was carried out, forming the mesa A' shown in FIG. 6.

Then, this mesa A' was subjected to a heat treatment at 500° C. in a vapor environment for 150 minutes. This heat treatment forms an insulation area having an oxidization width of approximately 2.5 μm in the layer 4 exposed at the sides of the hexagonal recesses.

Therefore, 2.5-μm oxidized areas are formed at both side portions of the narrow portion A2' in FIG. 6 and the center portion is a non-oxidized area having a width of about 6.5 μm. And, oxidized areas having widths of about 2.5 μm are formed in the layer 4 at the sides of the hexagonal recesses of the wide portions A1', A1'.

After the insulation protection film 7 of $Si_3N_4$ was deposited on the entire surface of the mesa A', the insulation protection film 7 only at the top portion of the narrow portion A2' was removed by a width of 3 μm, thus exposing the contact layer 6. Then, Ti/Pt/Au was vapor-deposited on the entire surface by electron beam vapor deposition to form the upper electrode 8, and after the bottom surface of the n-type InP substrate 1 was polished to a thickness of approximately 100 μm, an AuGeNi alloy was vapor-deposited on the polished surface, thus forming the lower electrode 9.

Figure 3:
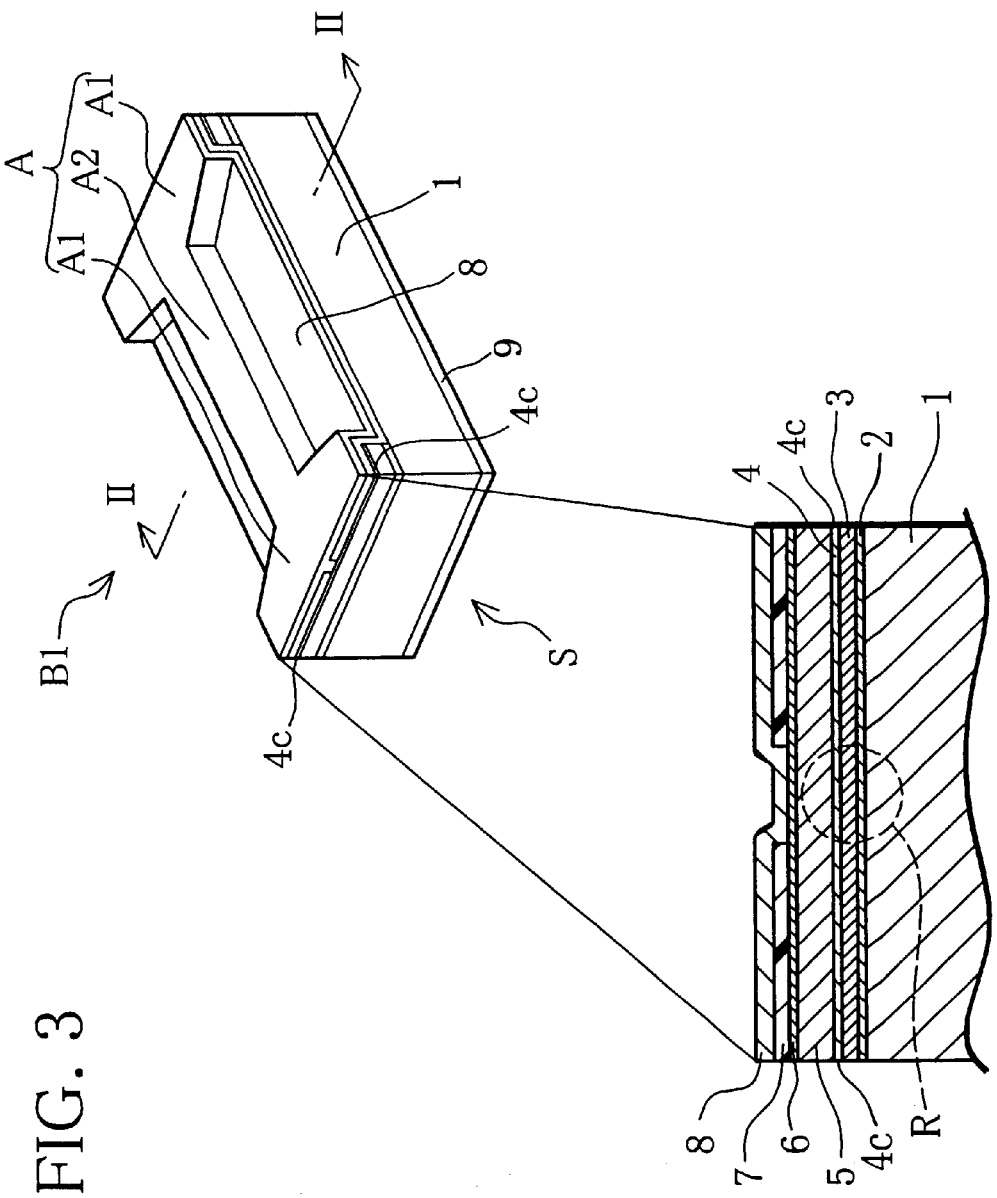
FIG. 3 is a perspective view showing the device B1 of this invention.

Next, cleaving was carried out at the center line between the linked wide portions A1', A1', yielding bars, which were then processed to be separated into individual devices, producing 50 devices B1 shown in FIG. 3. The device B1 is designated as a product of Example 1.

Devices B2 in a quantity of 50 were produced in the same way as Example 1 except that the aforementioned mask M2 was used. The device B2 is designated as a product of Example 2.

For comparison, devices B0 in a quantity of 50 were produced in the same way as Example 1 using a stripe pattern having a width of 7 μm as a mask. The device B0 is designated as a product of Comparative Example.

(2) Evaluation of Devices

The cleaved faces of the individual devices of Example 1, Example 2 and the Comparative Example were observed with a microscope. The cleaved faces of the devices B1 of Example 1 were all non-oxidized faces and generation of no cracks was seen at all. For the devices B2 of Example 2, there were 43 devices which had cracks C produced in the vicinity of both side portions 4a, 4a of the layer 4. However, those cracks C are located far from the luminescence area R having a width of approximately 5 μm and does not adversely affect the luminescence area R.

With regard to the devices B0 of the Comparative Example, there were 45 devices which had cracks C produced. And, the locations of the cracks C were in the vicinity of the luminescence area R and it was determined that such cracks apparently would adversely affect the luminescence area R.

The distributions of the threshold currents of those three types of devices B1, B2 and B0 were checked. The results associated with the devices B1 are shown in FIG. 10, the results associated with the devices B2 are shown in FIG. 11, and the results associated with the devices B0 are shown in FIG. 12.

Figure 10:
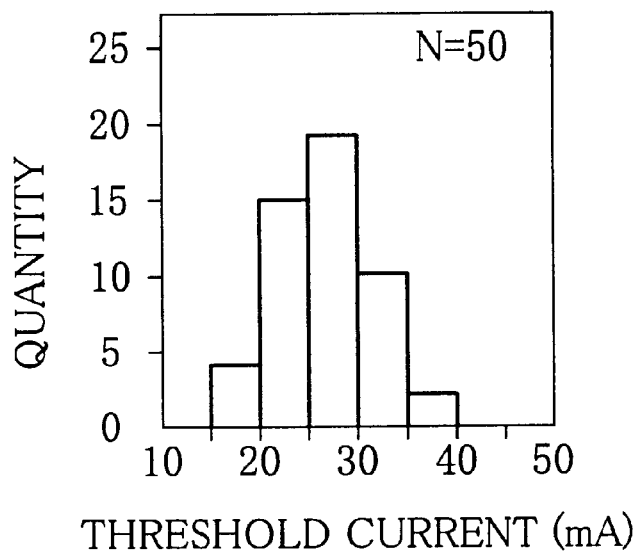
FIG. 10 is a graph showing the distribution of the threshold current of the device B1.
Figure 11:
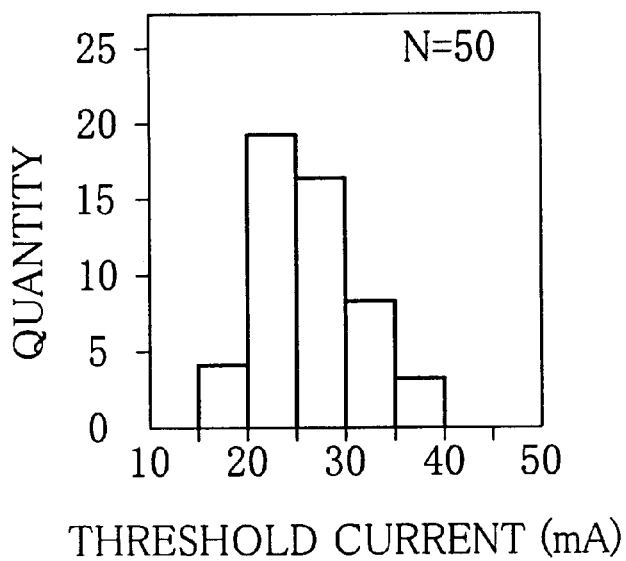
FIG. 11 is a graph showing the distribution of the threshold current of the device B2.
Figure 12:
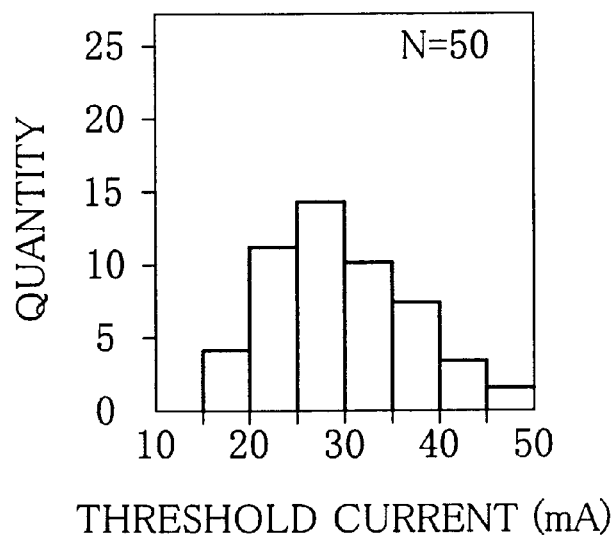
FIG. 12 is a graph showing the distribution of the threshold current of the device B0 with the conventional structure.

As apparent from FIGS. 10 to 12, the threshold current is distributed over a wide range of 15 to 50 mA for the devices B0 of the Comparative Example, whereas the threshold currents for the devices B1 and B2 of the Examples are in a range of 15 to 35 mA and have uniform characteristics.

Figure 1:
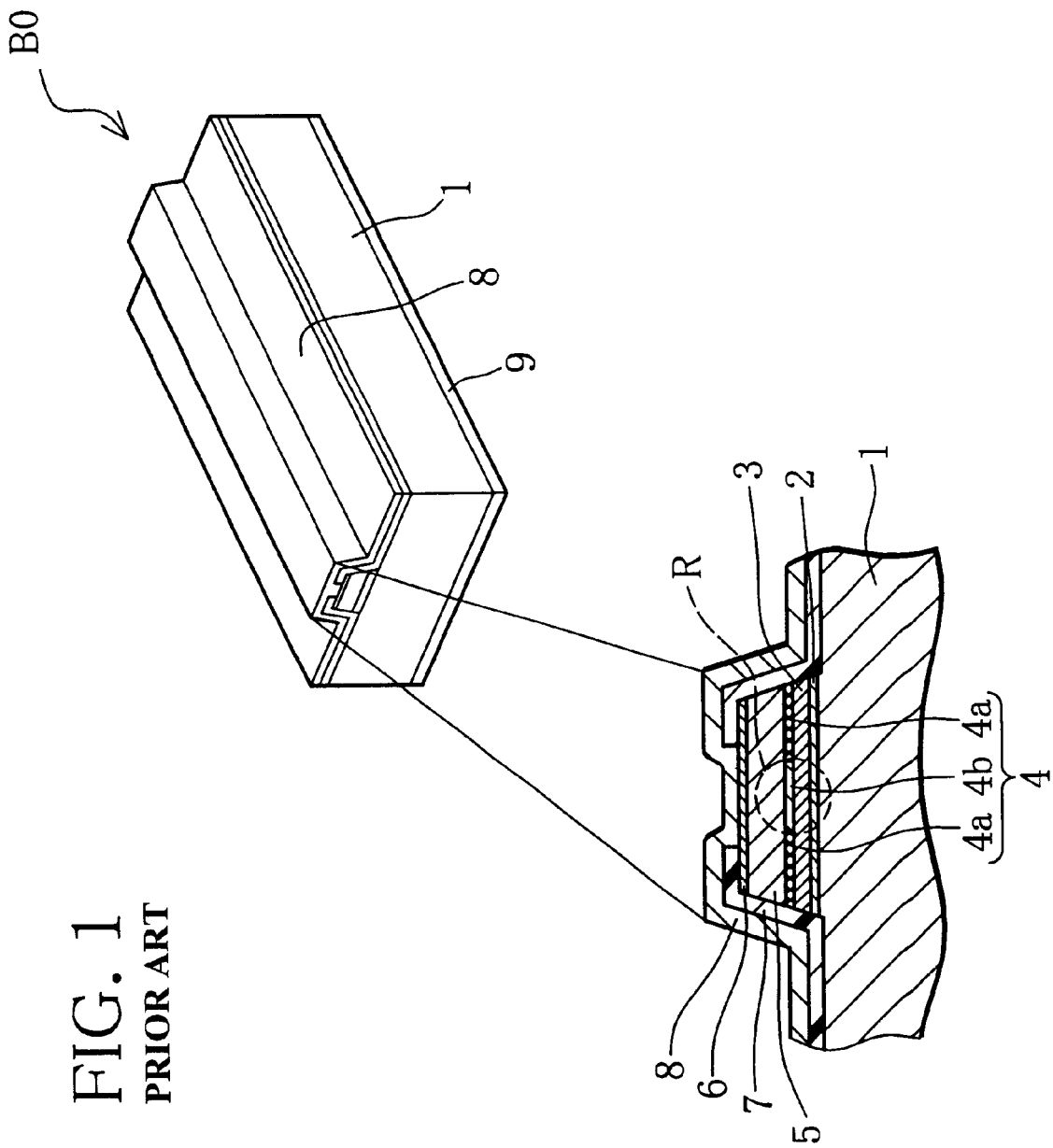
FIG. 1 is a perspective view showing the device B0 with the conventional structure.
Figure 2:
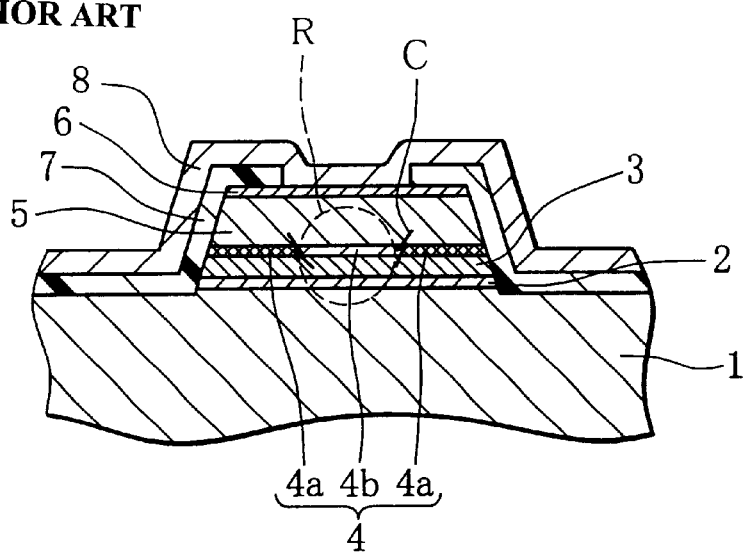
FIG. 2 is a cross-sectional view showing the cleaved face of the device B0.
Figure 4:
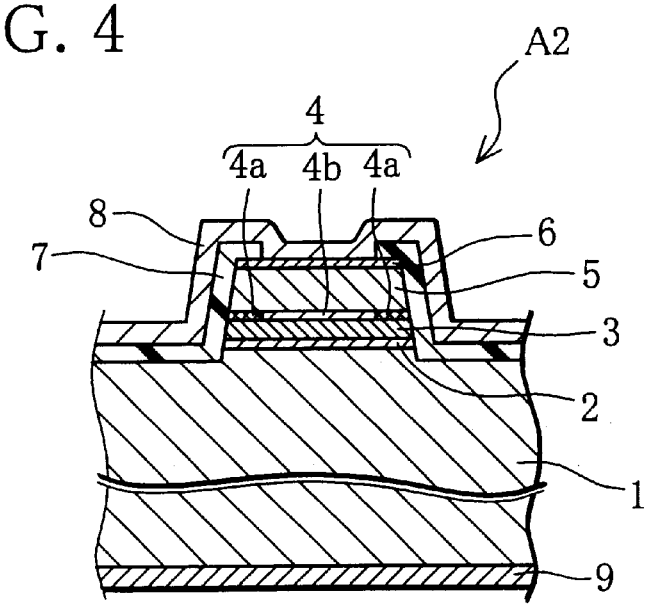
FIG. 4 is a cross-sectional view along the line IV—IV in FIG. 3.
Figure 7:
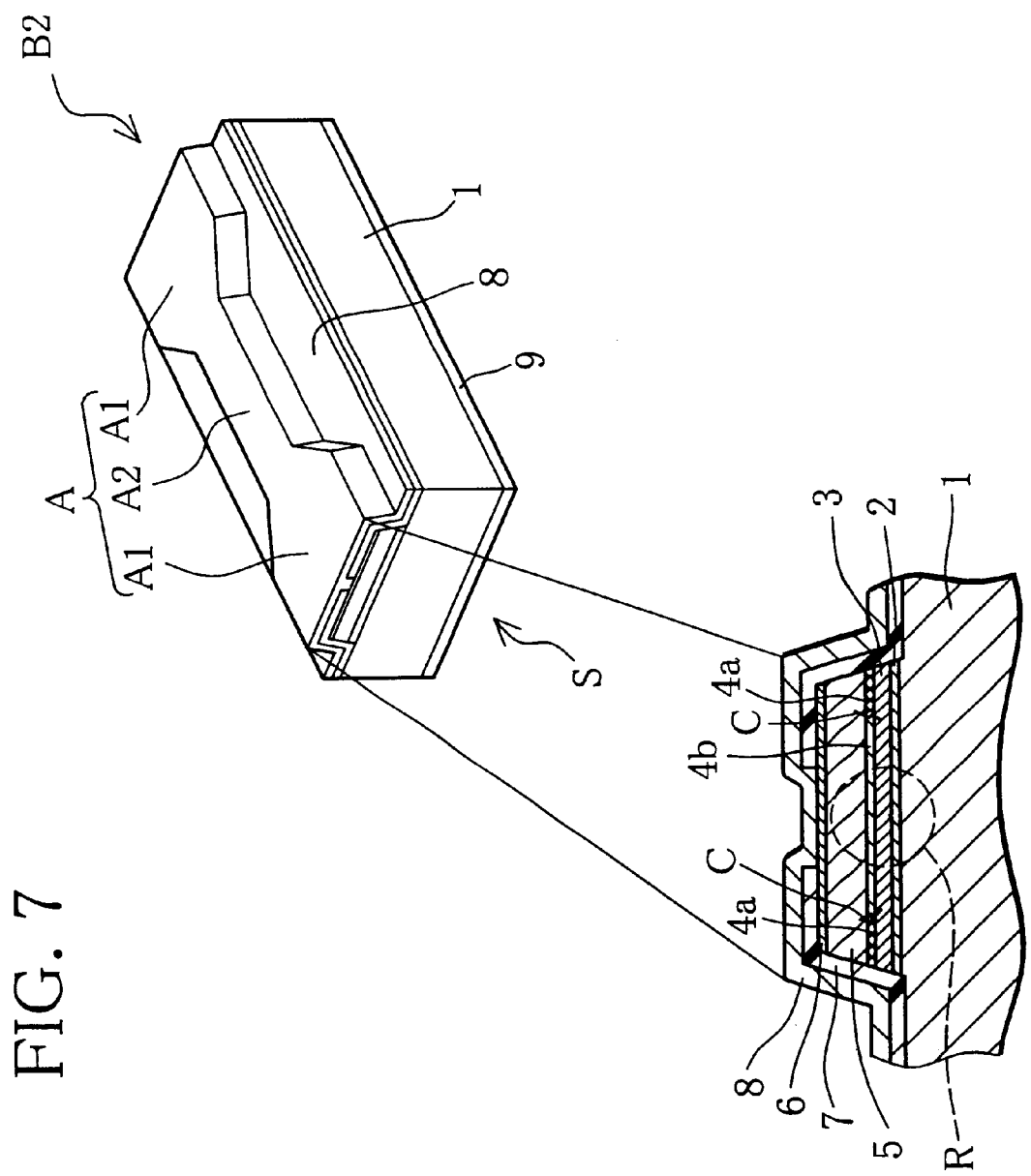
FIG. 7 is a perspective view illustrating another device B2 of this invention.

It appears that the above has resulted from the fact that many cracks C reaching the luminescence area R are produced in the devices B0 of Comparative Example as shown in FIG. 2 and the threshold current becomes higher for a large influence of the cracks C and becomes lower for a small influence of the cracks C. By way of contrast, it appears that the threshold current is low and becomes stable in both the devices B1 of Example 1 and the devices B2 of Example 2, because in the case of the cleaved face is a non-oxidized face and no cracks C occur as shown in FIG. 3, and in the case of the devices B2 of Example 2, although cracks C are produced in the cleaved face as shown in FIG. 7, the locations of the cracks are far from the luminescence area R.

It was confirmed that all of those laser devices were emitting light in single transverse mode.

A time-dependent change in the drive current of each device with the optical output of a laser beam being 5 mW was checked. The results are shown in FIG. 13.

Figure 13:
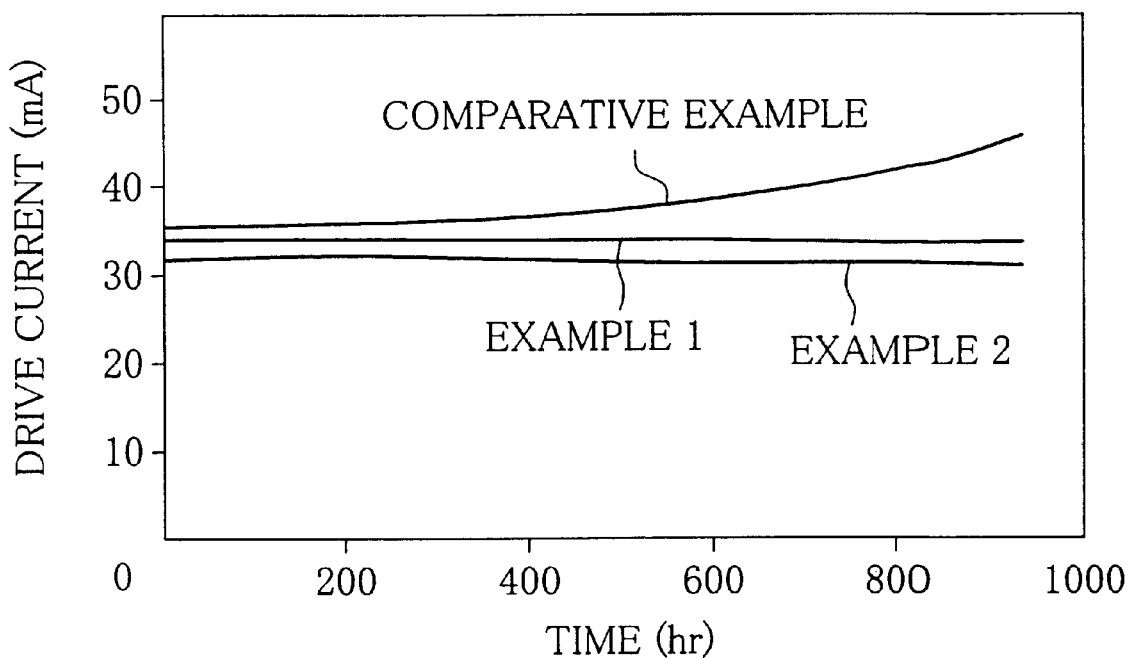
FIG. 13 is a graph showing a time-dependent change in the drive current of devices.

As apparent from FIG. 13, the drive current of the devices B0 of the Comparative Example increases as the time passes, whereas the drive current of each of the devices B1 and B2 of Examples 1 and 2 in which the luminescence area R is not adversely affected by the cracks C is stable.

Although an n-type substrate is used as the substrate in each of the above-described Examples, a p-type substrate may be used as well and the substrate material is not limited to InP and it may be GaAs.

As the semiconductor laser device of this invention does not have a defective cleaved face at the time of its production, it can be produced at a low cost, and it emits light in single transverse mode at a low threshold current and is not likely to cause a degradation of characteristics over a long operational period so that it has a significant industrial merit as a light source which leads to a cost reduction of optical communications and optical data transmission apparatus.

What is claimed is:

1. A semiconductor laser device comprising:

a resonator cavity having a first facet, a second facet, and a ridge, said ridge having a uniform thickness and extending between the first and second facets, said ridge including an active layer having a predetermined thickness and a layer containing an Al-containing compound, wherein said layer has oxidized regions formed on both sides thereof, the oxidized regions extending along the sides of said layer, respectively, except in vicinities of said first and second facets.

2. A semiconductor laser device comprising:

a resonator cavity having a first facet, a second facet, and a ridge, said ridge extending between the first and second facets, and including an active layer having a uniform thickness and la layer containing an Al-containing compound, wherein said layer has oxidized regions formed on both sides thereof, the oxidized regions extending along the sides of said layer, respectively, except in vicinities of said first and second facets.

3. A semiconductor laser device comprising:

a resonator cavity having a first facet, a second facet, and a ridge, said ridge having a uniform thickness and extending between the first and second facets, said ridge having end portions and an intermediate portion located between the end portions, and including a layer, the end portions being wider than the intermediate portion, said layer containing Al-containing compound, wherein said layer has oxidized regions formed on both sides thereof and a non-oxidized region located between the oxidized regions, the non-oxidized region being wider at the end portions than at the intermediate portion.

* * * * *